(12) United States Patent
Baldwin et al.

(10) Patent No.: US 10,681,828 B1
(45) Date of Patent: Jun. 9, 2020

(54) ELECTRICAL DEVICE COVER WITH HINGE PIN LOCK

(71) Applicants: Jeffrey P. Baldwin, Phoenix, AZ (US); John E. Klein, Gilbert, AZ (US)

(72) Inventors: Jeffrey P. Baldwin, Phoenix, AZ (US); John E. Klein, Gilbert, AZ (US)

(*) Notice: Subject to any disclaimer, the term of this patent is extended or adjusted under 35 U.S.C. 154(b) by 402 days.

(21) Appl. No.: 15/458,851

(22) Filed: Mar. 14, 2017

Related U.S. Application Data

(60) Provisional application No. 62/308,742, filed on Mar. 15, 2016.

(51) Int. Cl.
| | |
|---|---|
| *H05K 5/02* | (2006.01) |
| *E05D 3/06* | (2006.01) |
| *E05D 5/12* | (2006.01) |
| *E05D 11/00* | (2006.01) |
| *H05K 5/03* | (2006.01) |

(52) U.S. Cl.
CPC ............. *H05K 5/0226* (2013.01); *E05D 3/06* (2013.01); *E05D 5/12* (2013.01); *E05D 11/0054* (2013.01); *H05K 5/0221* (2013.01); *H05K 5/03* (2013.01); *E05Y 2900/60* (2013.01)

(58) Field of Classification Search
CPC ........ H05K 5/0226; E05D 5/12; E05D 5/128; E05D 7/1055; E05D 2011/0045
See application file for complete search history.

(56) References Cited

U.S. PATENT DOCUMENTS

| | | | | |
|---|---|---|---|---|
| 9,329,576 | B1* | 5/2016 | Baldwin | G04B 37/00 |
| 2005/0077255 | A1* | 4/2005 | Schluter | E05D 5/121 |
| | | | | 211/26 |
| 2013/0335893 | A1* | 12/2013 | Liang | G06F 1/1681 |
| | | | | 361/679.01 |

* cited by examiner

*Primary Examiner* — Andrew T Kirsch
*Assistant Examiner* — Don M Anderson
(74) *Attorney, Agent, or Firm* — Booth Udall Fuller, PLC

(57) ABSTRACT

An electrical device cover assembly having a hinge pin lock is disclosed. The electrical device cover assembly comprises a base having at least a first base hinge aperture and a lid having at least a first lid hinge aperture. The lid is hingedly coupled to the base along an axis by at least a first pin coupled to both the first base hinge aperture and the first lid hinge aperture. The hinge pin lock comprises an opening sized to receive a portion of at least the first pin in a direction normal to the axis, and at least a first locking surface. The hinge pin lock is directly and releasably coupled to the first pin such that the first locking surface is between a first pin capture surface of the first pin and a head of the first pin. The electrical device cover assembly may further comprise a second pin.

12 Claims, 15 Drawing Sheets

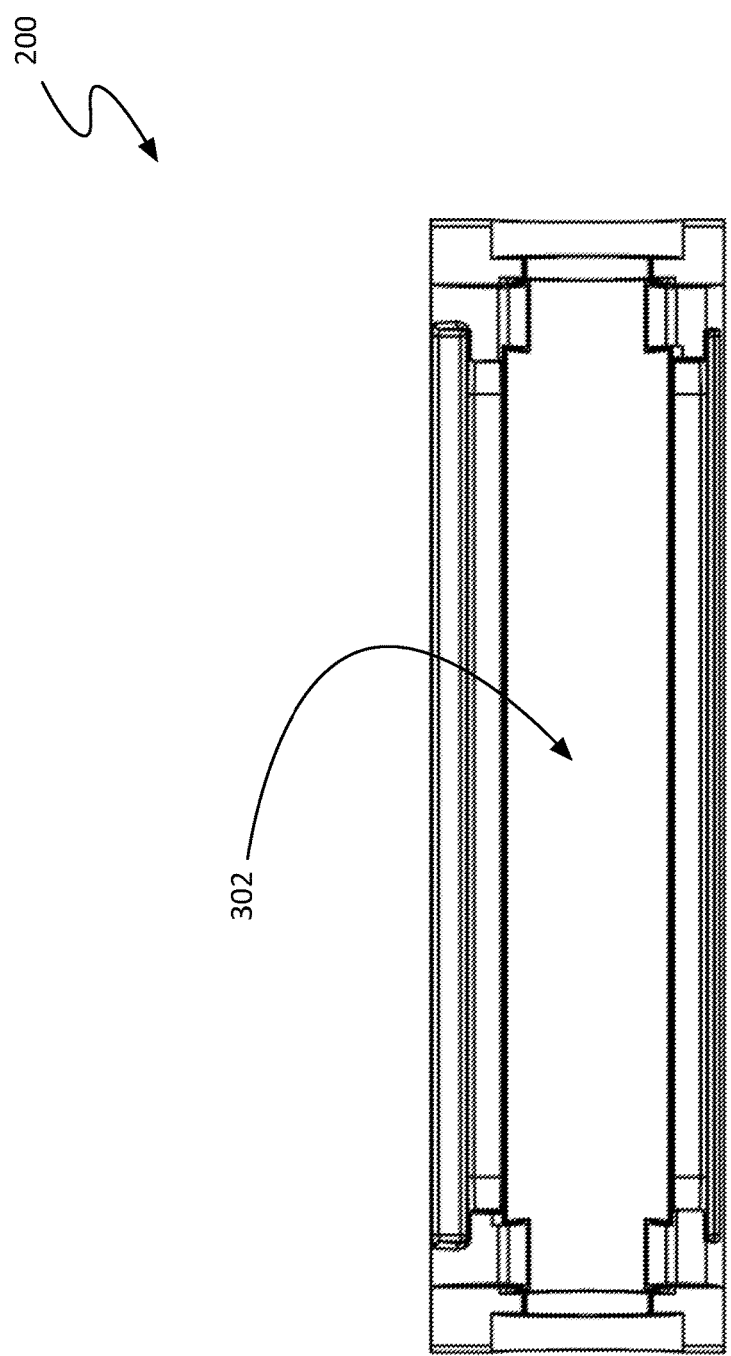

ELECTRICAL DEVICE COVER WITH HINGE PIN LOCK

RELATED APPLICATIONS

This application claims the benefit of U.S. provisional patent application 62/308,742, filed Mar. 15, 2016 titled "Pin Lock," the entirety of the disclosure of which is hereby incorporated by this reference.

TECHNICAL FIELD

Aspects of this document relate generally to electrical device enclosures.

BACKGROUND

Enclosures for electrical devices and outlets are sometimes employed to prevent unauthorized access. Conventional cover assemblies often make use of a lid that hinges on a base; the lid may be locked in a closed position to prevent access. Although these assemblies include some components for locking, such as a lock or padlock receiver, the hinge itself often remains a weak security point.

Cover assembly hinges often make use of one or more hinge pins. If the pins are removed, the device or outlet being covered may be accessed, sometimes without removing a padlock locking the lid to the base.

SUMMARY

According to one aspect, an electrical device cover assembly includes a base comprising a first base hinge aperture and a second base hinge aperture, and a lid comprising a first lid hinge aperture and a second lid hinge aperture. The lid is hingedly coupled to the base along an axis by a first pin coupled to both the first base hinge aperture and the first lid hinge aperture, and a second pin, separate from the first pin, coupled to both the second base hinge aperture and the second lid hinge aperture. The electrical device cover assembly further includes a hinge pin lock comprising an opening sized to receive a portion of at least the first pin in a direction normal to the axis. The hinge pin lock also comprises a first locking surface and a second locking surface opposite the first locking surface. The hinge pin lock is directly and releasably coupled to the first pin and the second pin and positioned between the first base hinge aperture and the second base hinge aperture such that the first locking surface is between a first pin capture surface of the first pin and a head of the first pin, and the second locking surface is between a second pin capture surface of the second pin and a head of the second pin. One of the base and the lid further comprises a hinge lock shield covering a majority of the hinge pin lock when the lid is in a closed position with respect to the base.

Particular embodiments may comprise one or more of the following features. The hinge pin lock may further comprise a first protrusion that may comprise the first locking surface and/or a second protrusion that may comprise the second locking surface. The first protrusion may be mated to the first pin at least along the first pin capture surface. The second protrusion may be mated to the second pin at least along the second pin capture surface. Finally, the hinge pin lock may further comprise at least one removal tab extending away from the opening.

According to another aspect, an electrical device cover assembly includes a base comprising a first base hinge aperture and a second base hinge aperture, and a lid comprising a first lid hinge aperture and a second lid hinge aperture. The lid is hingedly coupled to the base along an axis by a first pin coupled to both the first base hinge aperture and the first lid hinge aperture, and a second pin, separate from the first pin, coupled to both the second base hinge aperture and the second lid hinge aperture. The electrical device cover assembly further includes a hinge pin lock comprising an opening sized to receive a portion of at least the first pin in a direction normal to the axis. The hinge pin lock also comprises a first locking surface and a second locking surface opposite the first locking surface. The hinge pin lock is directly and releasably coupled to the first pin and the second pin such that the first locking surface is between a first pin capture surface of the first pin and a head of the first pin, and the second locking surface is between a second pin capture surface of the second pin and a head of the second pin. Particular embodiments may be modified or adapted such that one of the base and the lid may further comprise a hinge lock shield covering a majority of the hinge pin lock when the lid is in a closed position with respect to the base.

According to yet another aspect, an electrical device cover assembly includes a base comprising a first base hinge aperture and a lid comprising a first lid hinge aperture. The lid is hingedly coupled to the base along an axis by at least a first pin coupled to both the first base hinge aperture and the first lid hinge aperture. The electrical device cover assembly further includes a hinge pin lock comprising an opening sized to receive a portion of the first pin in a direction normal to the axis, and a first locking surface. The hinge pin lock is directly and releasably coupled to the first pin such that the first locking surface is between a first pin capture surface of the first pin and a head of the first pin.

Particular embodiments may comprise one or more of the following features. A portion of one of the base and the lid may be between the hinge pin lock and the head of the first pin. Finally, a capture surface of one of the base and the lid may be between a locking surface of the hinge pin lock and the head of the first pin.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112, ¶6. Thus, the use of the words "function," "means" or "step" in the Detailed Description or Description of the Drawings or claims is not intended to somehow indicate a desire to invoke the special provisions of 35 U.S.C. § 112, ¶6, to define the invention. To the contrary, if the provisions of 35 U.S.C. § 112, ¶6 are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112, ¶6. Moreover, even if the provisions of 35 U.S.C. § 112, ¶6 are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

The inventions will hereinafter be described in conjunction with the appended drawings, where like designations denote like elements, and:

FIG. 3B is a rear view of a hinge pin lock;

DETAILED DESCRIPTION

Figure 1A:
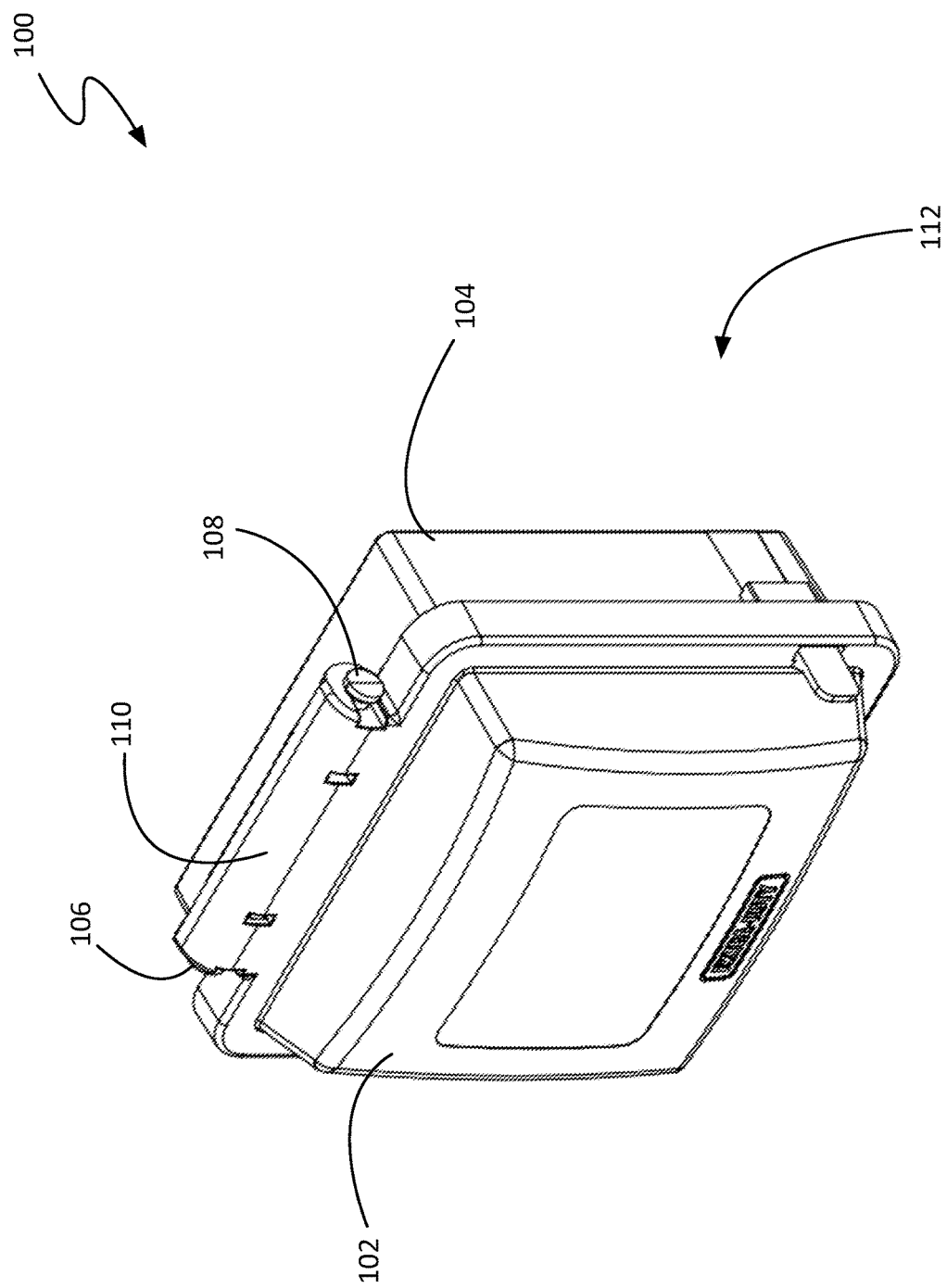
FIG. 1A is a front perspective view of an electrical device cover assembly in a closed position.

This disclosure, its aspects and implementations, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspect of the disclosed concepts to the embodiments illustrated.

Figure 1B:
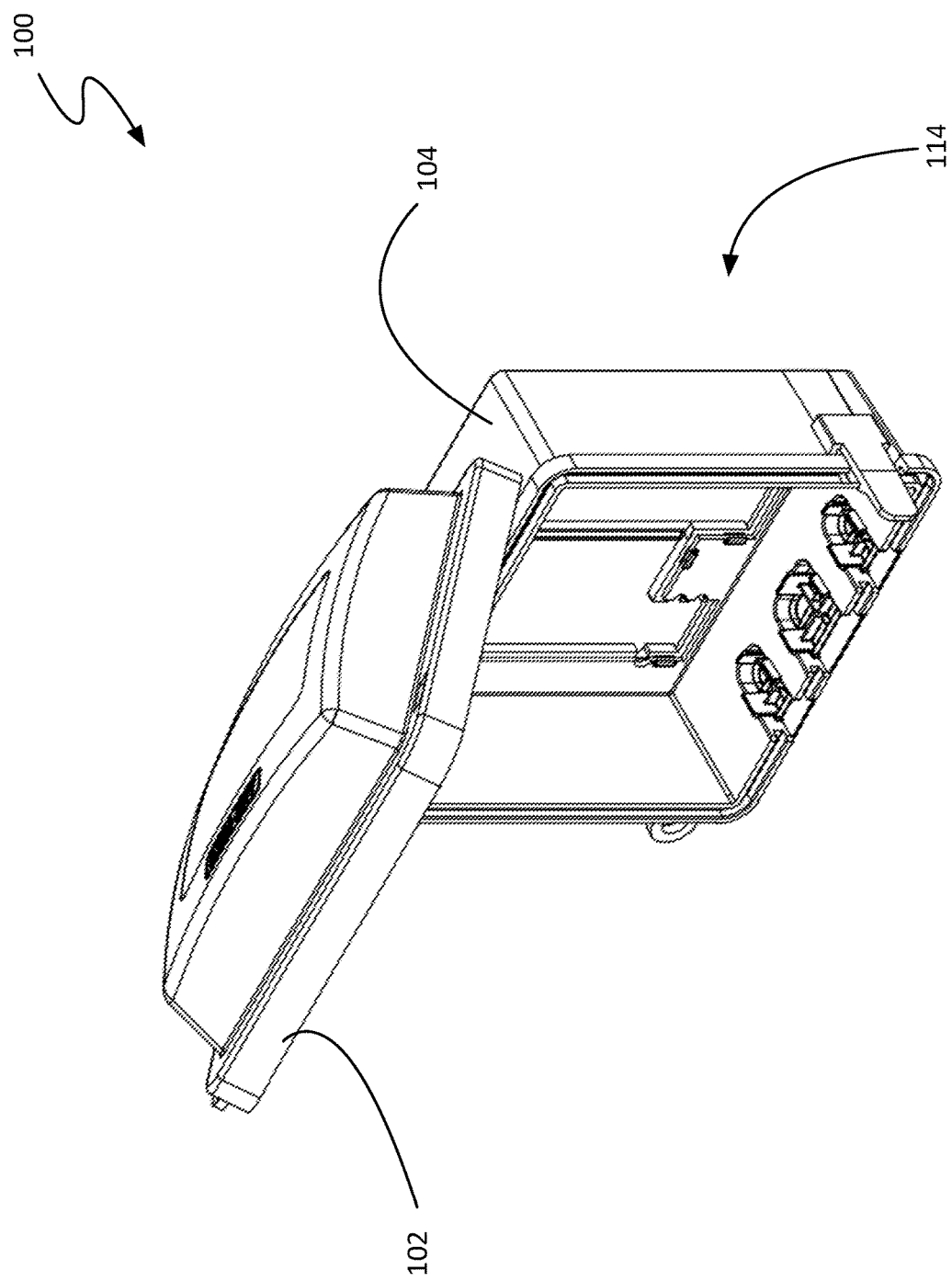
FIG. 1B is a front perspective view of the electrical device cover assembly of FIG. 1A in an open position.
Figure 2:
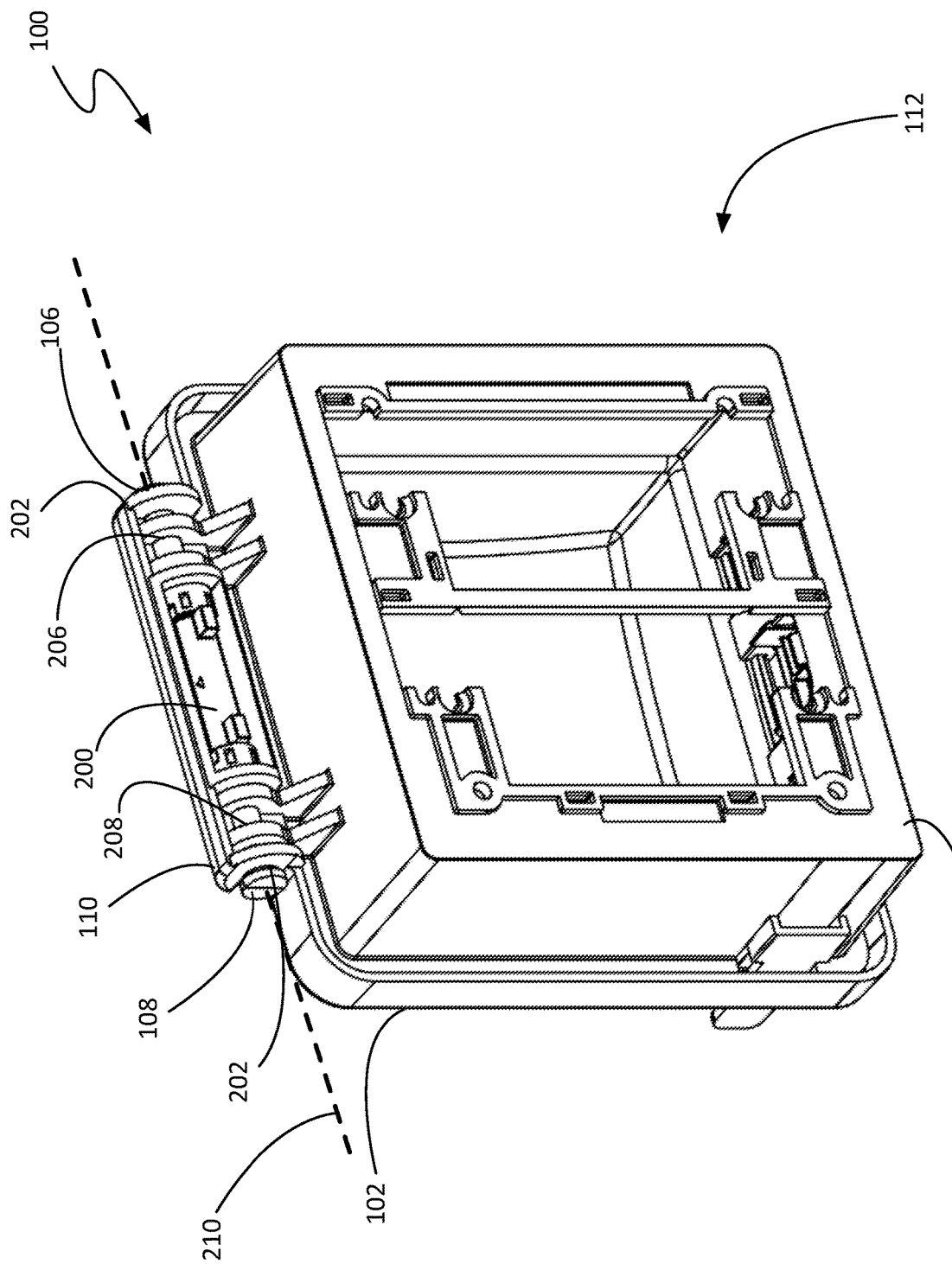
FIG. 2 is a rear perspective view of the electrical device cover assembly of FIG. 1A in a closed position.

FIGS. 1 and 2 depict perspective views of a non-limiting example of an electrical outlet cover assembly 100. As shown, the electrical outlet cover assembly 100 comprises a lid 102, a base 104, a first pin 106, a second pin 108, a hinge lock shield 110, and a hinge pin lock 200, according to various embodiments. FIGS. 1A and 2 show assembly 100 in a closed position 112, while FIG. 1B shows assembly 100 in an open position 114.

Enclosures for electrical devices and outlets are sometimes employed to prevent unauthorized access. Conventional cover assemblies often make use of a lid that hinges on a base; the lid may be locked in a closed position to prevent access. Although these assemblies often include some means for locking, such as a lock or a padlock receiver, the lid itself often remains a weak security point.

Cover assembly hinges often make use of one or more hinge pins, which tend to be stronger than other types of hinges. If the pins are removed, the device or outlet being covered may become accessible.

Advantageously, embodiments of an outlet cover assembly 100 make use of a hinge pin lock 200 to secure a first pin 106 of the hinge to a second pin 108 of the hinge. As shown, the lid 102 is hingeably coupled to the base 104 along an axis 210 by the first pin 106 being situated within a first lid hinge aperture 202 and a first base hinge aperture 206, and the second pin 108 being situated within a second lid hinge aperture 204 and a second base hinge aperture 208, according to various embodiments. Other embodiments may make use of additional or different types of apertures to receive the hinge pins.

As shown in FIG. 2, the hinge pin lock 200 is situated in between the two pins. The hinge pin lock 200 will be discussed in greater detail with respect to FIGS. 3A-3D. In some embodiments, the hinge pin lock 200 may be located behind a hinge lock shield 110. In the context of the present description and the claims that follow, a hinge lock shield 110 refers to a structure that covers a majority of the hinge pin lock 200 when the lid is in a closed position 112 with respect to the base. In some embodiments, the hinge lock shield 110 may be part of the lid 102, while in others it may be part of the base 104.

A closed position 112 refers to a configuration of the lid 102 and base 104 where the lid may be secured to prevent access to the outlet or device inside the assembly 100. An open position 114 is any position that is not a closed position 112, according to various embodiments.

As will be discussed in greater detail with respect to FIGS. 3A-3D, one of the advantages of a hinge pin lock 200 is that it may be easily installed and removed. The use of a hinge pin lock 200 in conjunction with a hinge lock shield 110 is advantageous, as the hinge lock shield 110 serves to protect the hinge pin lock 200 from unauthorized removal. In some embodiments, the hinge lock shield 110 may prevent access to the hinge pin lock 200 from any direction except for from the rear. Cover assemblies 100 are typically mounted to an object such as a wall or an electrical outlet box. By restricting access to the hinge pin lock 200 with the hinge lock shield 110 from all directions except from the rear, the hinge pin lock 200 will be very difficult to remove once the assembly 100 has been installed.

In other embodiments, the hinge lock shield 110 may be configured such that the hinge pin lock 200 is only accessible from the front of the assembly 100, when the assembly 100 is in an open position 114. Such a configuration ensures that the hinge pin lock 200 secures the pins in place when the assembly 100 is closed, and may be easily removed when the assembly 100 has been opened by an authorized person (e.g. someone with a key to the lock, etc.).

Embodiments of an electrical outlet cover assembly 100, and implementing components, may be composed of a wide variety of materials known in the art. For example, the components may be formed of: metals; polymers such as thermoplastics (such as ABS, Fluoropolymers, Polyacetal, Polyamide; Polycarbonate, Polyethylene, Polysulfone, and/or the like); thermosets (such as Epoxy, Phenolic Resin, Polyimide, Polyurethane, Silicone, and/or the like), any combination thereof, and/or other like materials. Those of ordinary skill in the art will readily be able to select appropriate materials and manufacture these products from the disclosures provided herein.

In use, electrical outlet cover assembly 100 may be attached to an object proximate to an electrical outlet through the base 104. The object proximate to the electrical outlet may comprise various items, such as a wall, a ceiling, or a floor in a house, an outcropping or island (such as a kitchen island) in a house, another structure in a house, a portion of a vehicle, a portion of a machine, an electrical outlet mounting box or any other item. According to various embodiments, the assembly 100 may be attached by screws, bolts, nails, or the like which pass through holes in the base 104. Advantageously, the points of attachment may be contained within the lid 102 when the assembly 100 is in a closed position, preventing unauthorized access.

Figure 3A:
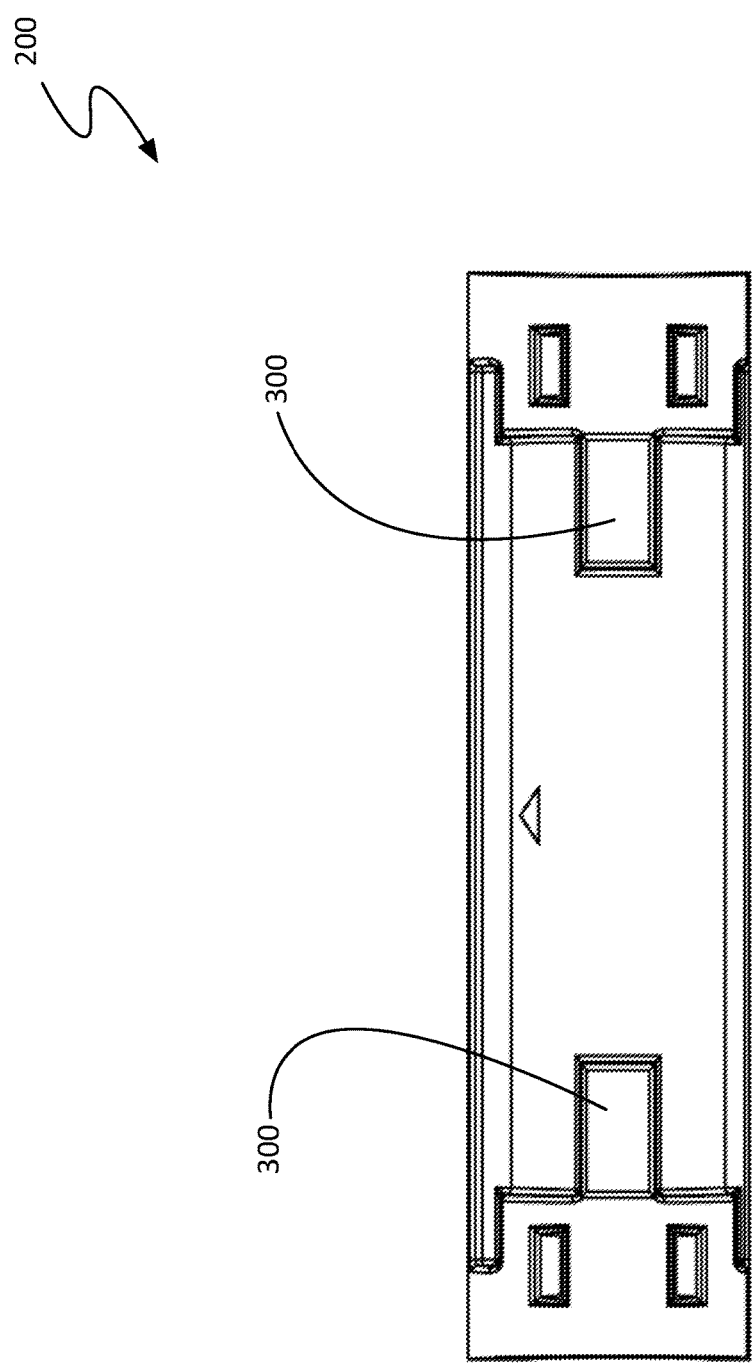
FIG. 3A is a front view of a hinge pin lock.
Figure 3C:
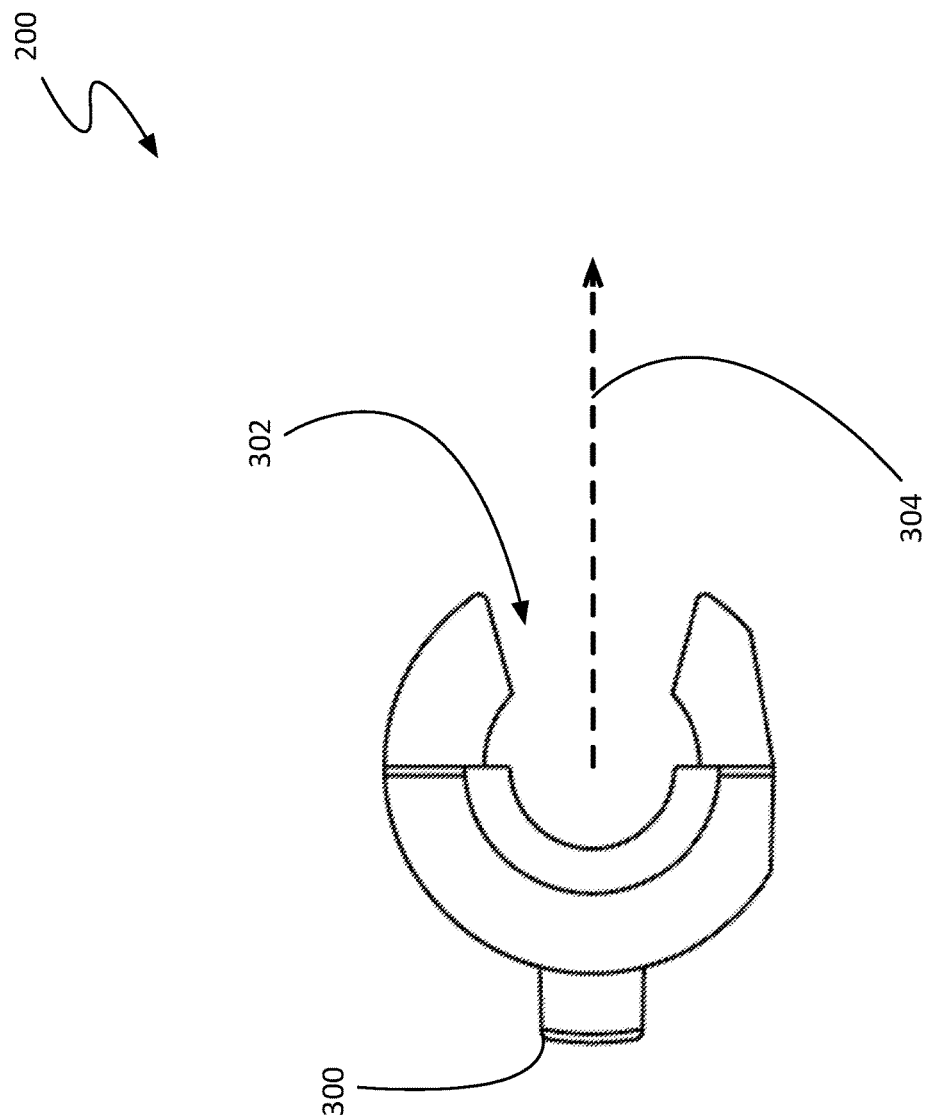
FIG. 3C is a side view of a hinge pin lock.
Figure 3D:
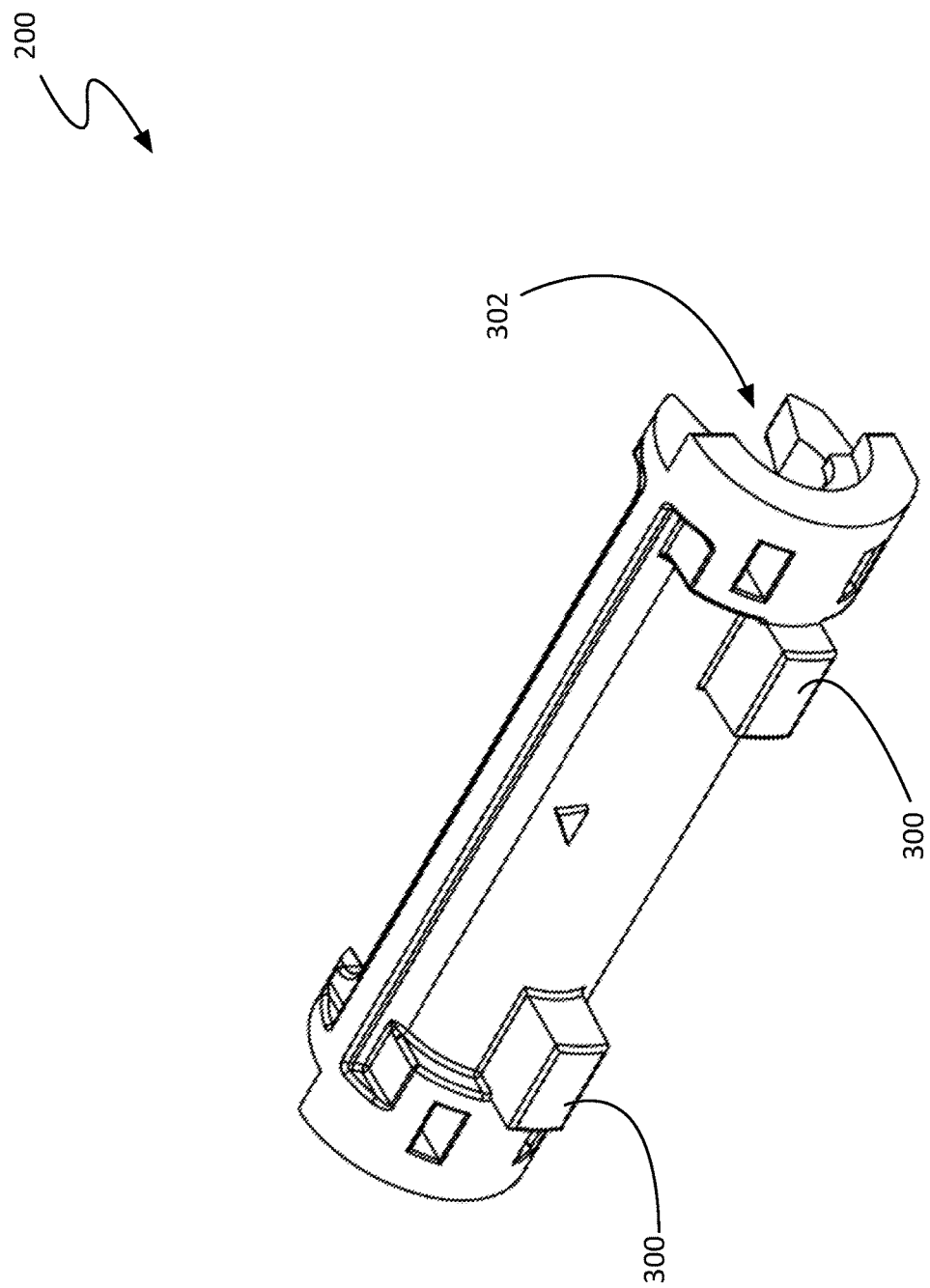
FIG. 3D is a perspective view of a hinge pin lock.

According to various embodiments, base 104 (as well as lid 102) may be sized and configured for use with electrical outlets and devices that vary in type (e.g. standard outlet, GCFI outlet, etc.) and number (e.g. 1-gang, 2-gang, etc.). In one particular implementation, the base 104 may comprise an adaptable plate comprising removable or punch-out portions allowing it to adapt to various types of electrical outlets. For instance the adaptable plate may be adaptable to receive a standard outlet, or a GCFI outlet, and so forth, according to the portions of the adaptable plate that are selectively punched out or removed. As such, the base 104 may be manufactured such that the opening is not formed until the user punches out or removes certain portions of the adaptable plate. In other embodiments, the base 104 may be configured at the time of manufacture to receive a particular size and type of outlet or device FIGS. 3A to 3D depict various views of a non-limiting example of a hinge pin lock 200. Specifically, FIG. 3A shows a front view, FIG. 3B shows a rear view, FIG. 3C shows a side view, and FIG. 3D shows a perspective view. As shown, the hinge pin lock 200 comprises an opening 302 for receiving at least a portion of at least one hinge pin (e.g. first pin 106, etc.) in a direction 304 normal to the hinge axis 210. In other words, the opening 302 is sized and shaped to receive one or more pins as the hinge pin lock 200 is pressed onto the pins to lock them in place.

In some embodiments, a hinge pin lock 200 may be used with two hinge pins, while in other embodiments, a hinge pin lock 200 may be used with a single hinge pin. Much of the following discussion will be in the context of a hinge pin lock 200 used with two pins (e.g. first pin 106 and second pin 108). However, it should be noted that the features and methods described, particularly how a hinge pin lock 200 interacts with a pin, may be adapted for use with a single hinge pin. Embodiments of a hinge pin lock 200 configured to receive a single pin will be discussed in greater detail with respect to FIGS. 7 through 9.

In some embodiments, hinge pin lock 200 may comprise a single opening 302 which may receive one or two pins. In other embodiments, hinge pin lock 200 may comprise two openings 302, each to receive a single hinge pin. As an option, the hinge pin lock 200 may have some sort of symbol to indicate the middle of the lock 200, and may be aligned with a similar mark on the assembly 100 to facilitate installation.

As shown in the side view of FIG. 3C, the hinge pin lock 200 may have a curved cross sectional shape, where the opening is slightly smaller than the hinge pins. When installed, the hinge pin lock 200 may deflect until the pins are inside the lock 200, where they are held in place. As an option, the surfaces of the hinge pin lock 200 that border the opening 302 may be angled to facilitate reception of the pins and deflection of the lock 200. In other embodiments, the hinge pin lock may have different shapes, which may have manufacturing advantages.

As shown, the hinge pin lock 200 may further comprise at least one removal tab 300. In the context of the present description and the claims that follow, a removal tab 300 may refer to a structure on the hinge pin lock 200 which may be used to pull the hinge pin lock 200 off of the hinge pin(s) to uninstall the lock 200. In some embodiments, the removal tabs 300 may extend out from the hinge pin lock 200. In other embodiments, the removal tabs 300 may be sunk into the surface of the hinge pin lock 200. In still other embodiments, the removal tabs 300 may be configured to be engaged with a particular, or possibly customized, tool.

The hinge pin lock 200 may be constructed from a variety of materials. In some embodiments, where the hinge pin lock 200 is designed to deflect around and then capture the hinge pins, the hinge pin lock 200 may be composed of strong, flexible materials such as metal, thermoplastic, and the like. In other embodiments, where the hinge pin lock 200 is not relying on deflection to perform, a more rigid material may be used.

Figure 4:
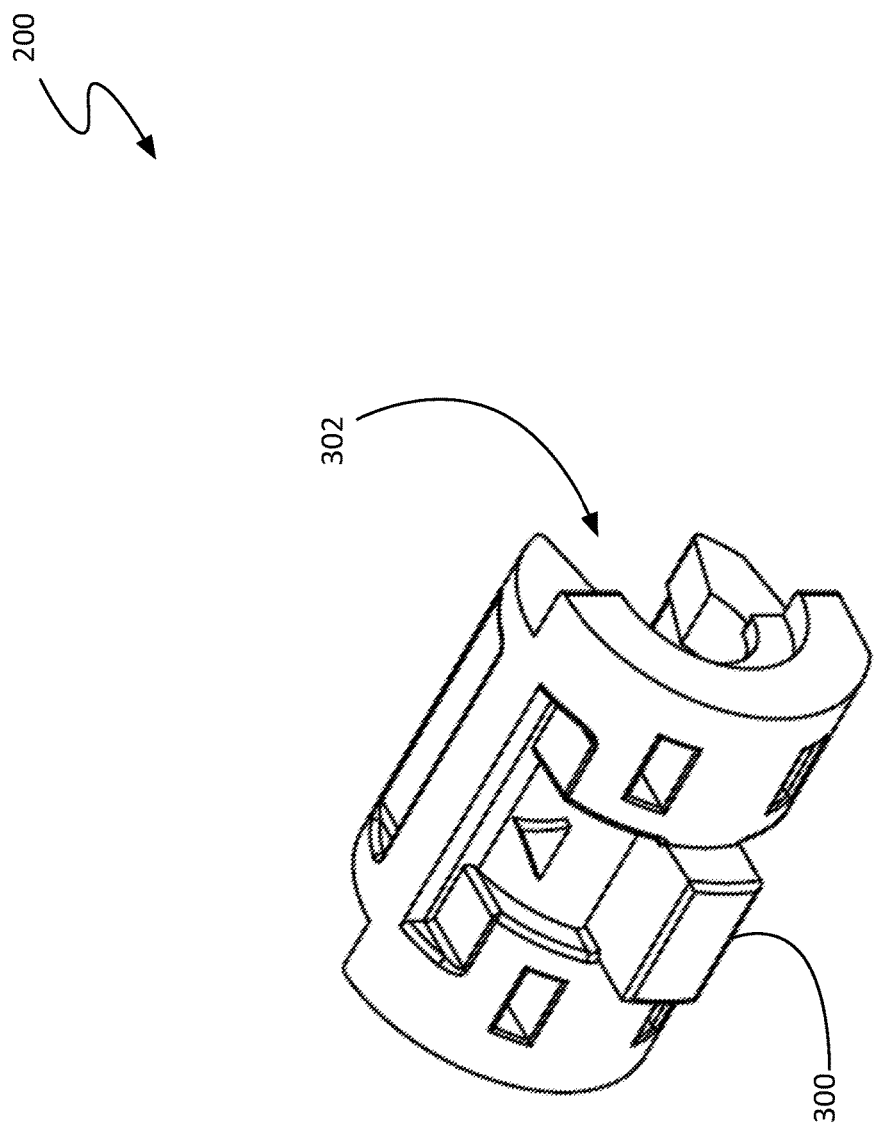
FIG. 4 is a perspective view of an alternate embodiment of a hinge pin lock.

The hinge pin lock 200, as well as the hinge lock shield 110, may be adapted for use with a variety of electrical outlet cover assemblies. For example, FIG. 4 depicts a non-limiting example of a hinge pin lock 200 configured for a smaller assembly 100. The length of a hinge pin lock 200 may depend upon the length of the hinge pin(s) with which it is being used, as well as the overall size of the assembly 100. In still other embodiments, the hinge pin lock 200 may be incorporated into the pins themselves. For example, the ends of the pins may be shaped to interlock when pushed together.

Figure 5A:
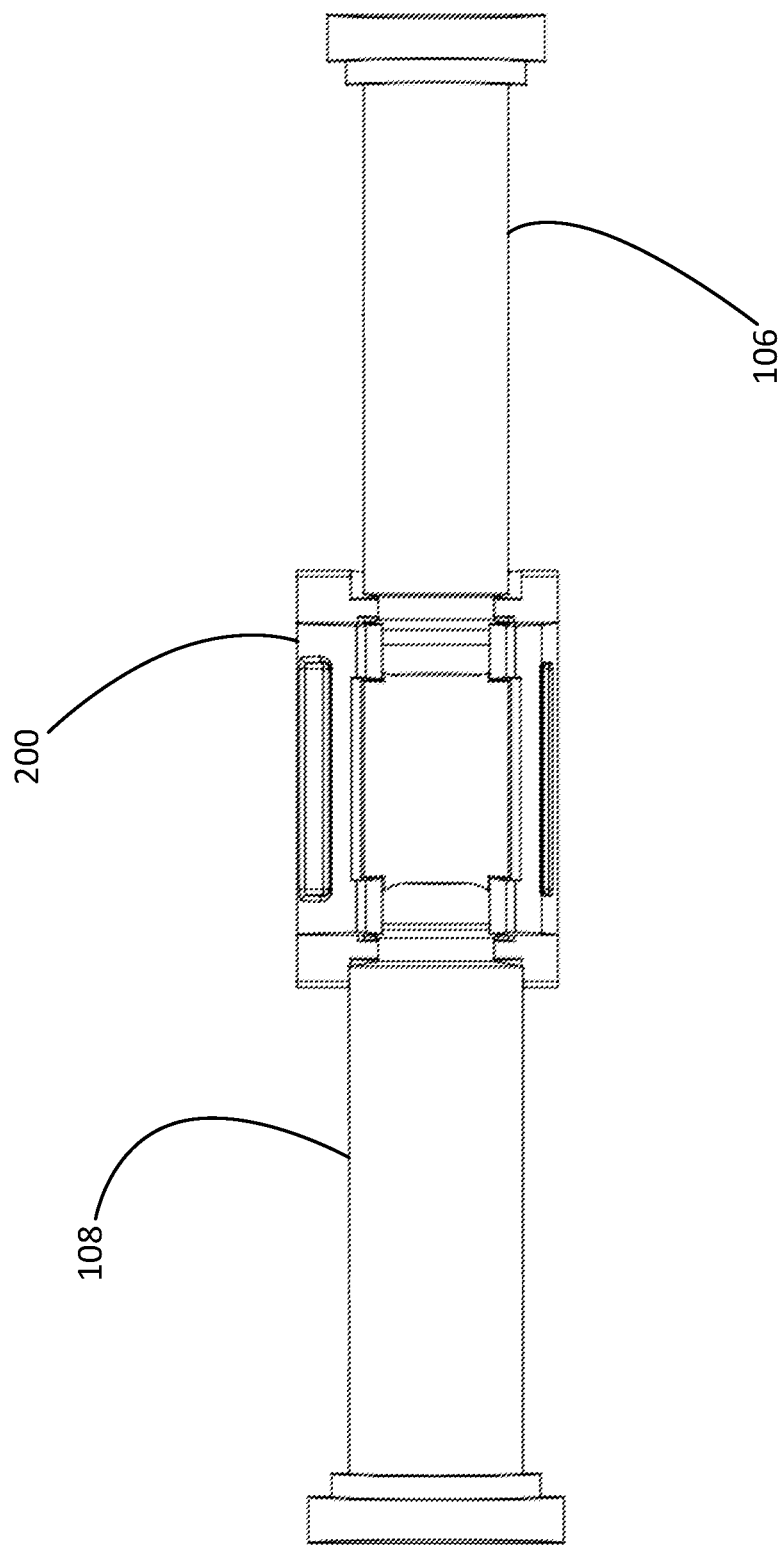
FIG. 5A is a rear view of a hinge pin lock, a first pin, and a second pin.
Figure 5B:
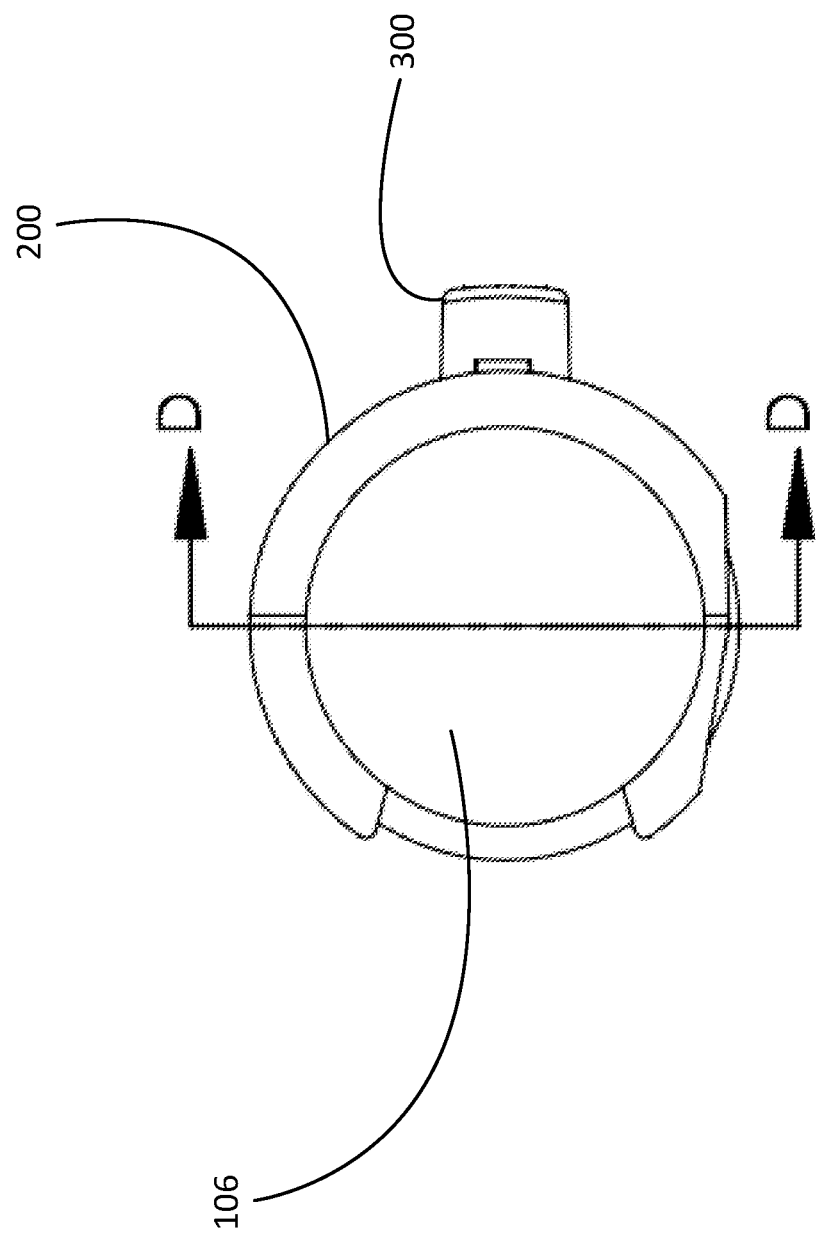
FIG. 5B is a side view of the hinge pin lock and pins of FIG. 5A.
Figure 5C:
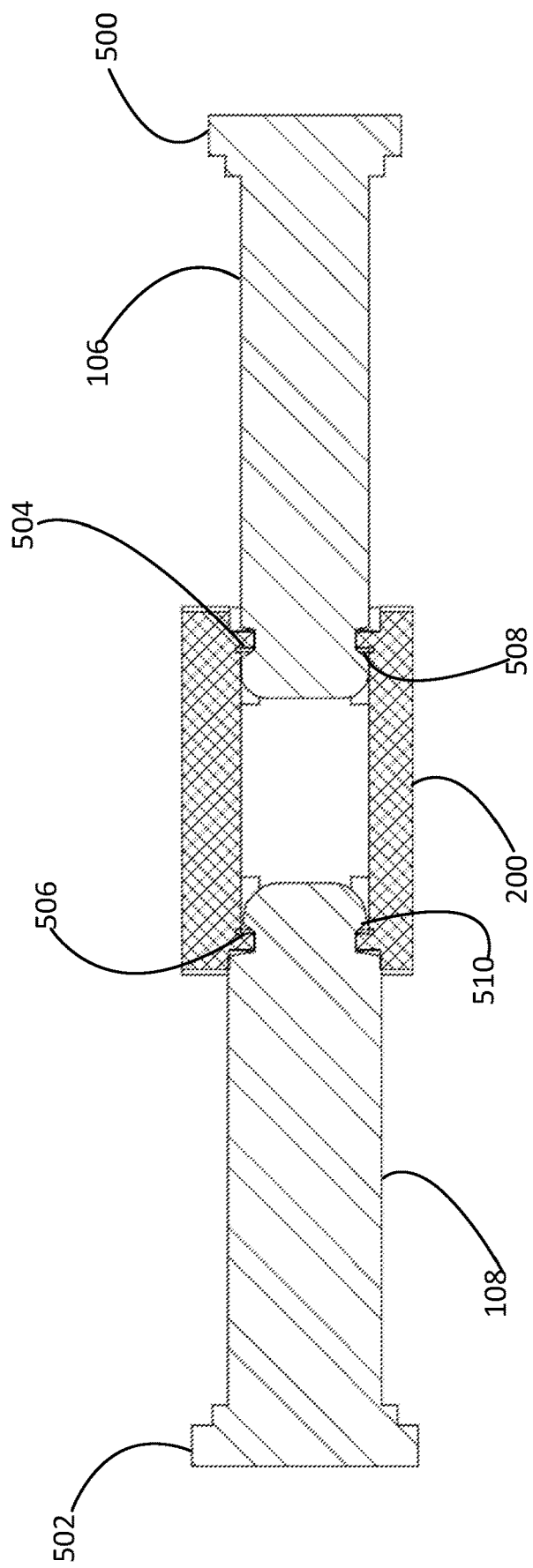
FIG. 5C is a cross-sectional view of the hinge pin lock and pins of FIG. 5A along D-D.

FIGS. 5A to 5C depict various views of a non-limiting example of a hinge pin lock 200 coupled to a first pin 106 and a second pin 108. Specifically, FIG. 5A shows a rear view, FIG. 5B shows a side view, and FIG. 5C shows a cross-sectional view along D-D.

As shown, the first pin 106 and second pin 108 each comprise a head (500 and 502, respectively). Opposite the head, each pin has a structure configured to engage with the hinge pin lock 200, according to various embodiments. In the embodiment depicted in FIGS. 5A and 5C, the pins have a notch near their ends, which is sized to receive a projection on the inside of the hinge pin lock 200.

In another embodiment, the pins may have projections near their ends, sized to mate with notches on the inside of the hinge pin lock 200. In still another embodiment, the pins may have holes that run partially or entirely through the pin normal to the axis 210. These holes may be filled with projections located on the inside of the hinge pin lock 200. Such an embodiment is discussed in greater detail with respect to FIG. 6.

In all these embodiments and others, the pin(s) comprise capture surfaces, and the hinge pin lock 200 comprises locking surfaces. See, for example, the cross-sectional view of FIG. 5C. As shown, the first pin 106 comprises a first pin capture surface 508 and the second pin 108 comprises a second pin capture surface 510. It should be noted that these two surfaces are annular in nature, extending around the circumference of the pins. Furthermore, the hinge pin lock 200 comprises a first locking surface 504 and a second locking surface 506. When the hinge pin lock 200 is installed, for each pin, the locking surface (e.g. locking surface 504, 506) is between the pin capture surface (e.g. pin capture surface 508, 510) and the head (e.g. head 500, 502).

FIG. 5C also shows that a hinge pin lock 200 may be adapted for use with pins of different thickness. Specifically, the stem (e.g. the body of the pin between the head and the capture surface) of the first pin 106 has a smaller radius than the stem of the second pin 108. As an option, the hinge pin lock 200 shown in FIG. 5C is symmetrical, such that the asymmetrical pins may be interchanged.

Figure 6:
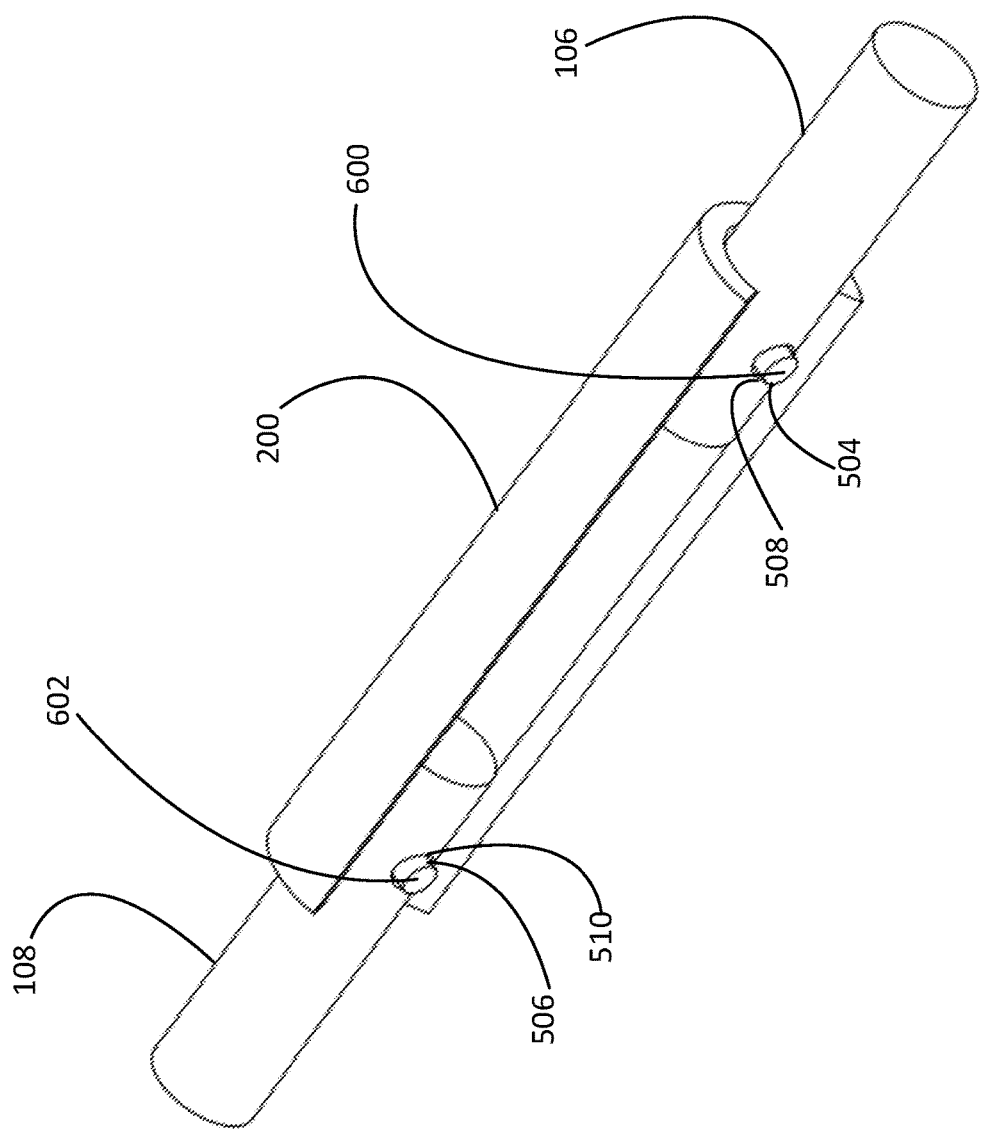
FIG. 6 is a perspective view of a hinge pin lock, a first pin, and a second pin.

FIG. 6 shows a perspective view of a non-limiting example of a hinge pin lock 200 making use of protrusions to pierce a first pin 106 and a second pin 108. As shown, hinge pin lock 200 comprises a first protrusion 600 and a second protrusion 602, according to various embodiments. These protrusions are configured to mate with apertures in the ends of the first pin 106 and the second pin 108.

Such a configuration may be advantageous, as the surface area of the locking surfaces 504, 506 (e.g. the surfaces of the protrusions facing away from their respective pin heads) facing the pin capture surfaces 508, 510 (e.g. the surfaces inside apertures of the pins facing the respective pin heads) is increased. The increased overlap may serve to increase the strength of the lock. However, such a configuration may be slightly more difficult to assemble, as the pins may need to be reoriented to receive the protrusions.

As previously mentioned, in some embodiments, a hinge pin lock 200 may be used with a single hinge pin. In such embodiments, an electrical device cover assembly 100 may comprise a single removable hinge pin. Specifically, the single hinge pin (e.g. first pin 106) is coupled to at least a lid hinge aperture (e.g. first lid hinge aperture 202, etc.) and a base hinge aperture (e.g. first base hinge aperture 206, etc.). The lid 102 may be hingedly coupled to the base 104 through additional couplings, for hinge strength and stability. For example, in some embodiments, the pin 106 may be coupled to additional base and/or lid hinge apertures. In other embodiments, the lid 102 and base 104 may comprise an additional hinged coupling aligned with the axis 210 of the first pin 106 (e.g. a rivet, a pivotable coupling between lid and base, etc.).

Figure 7:
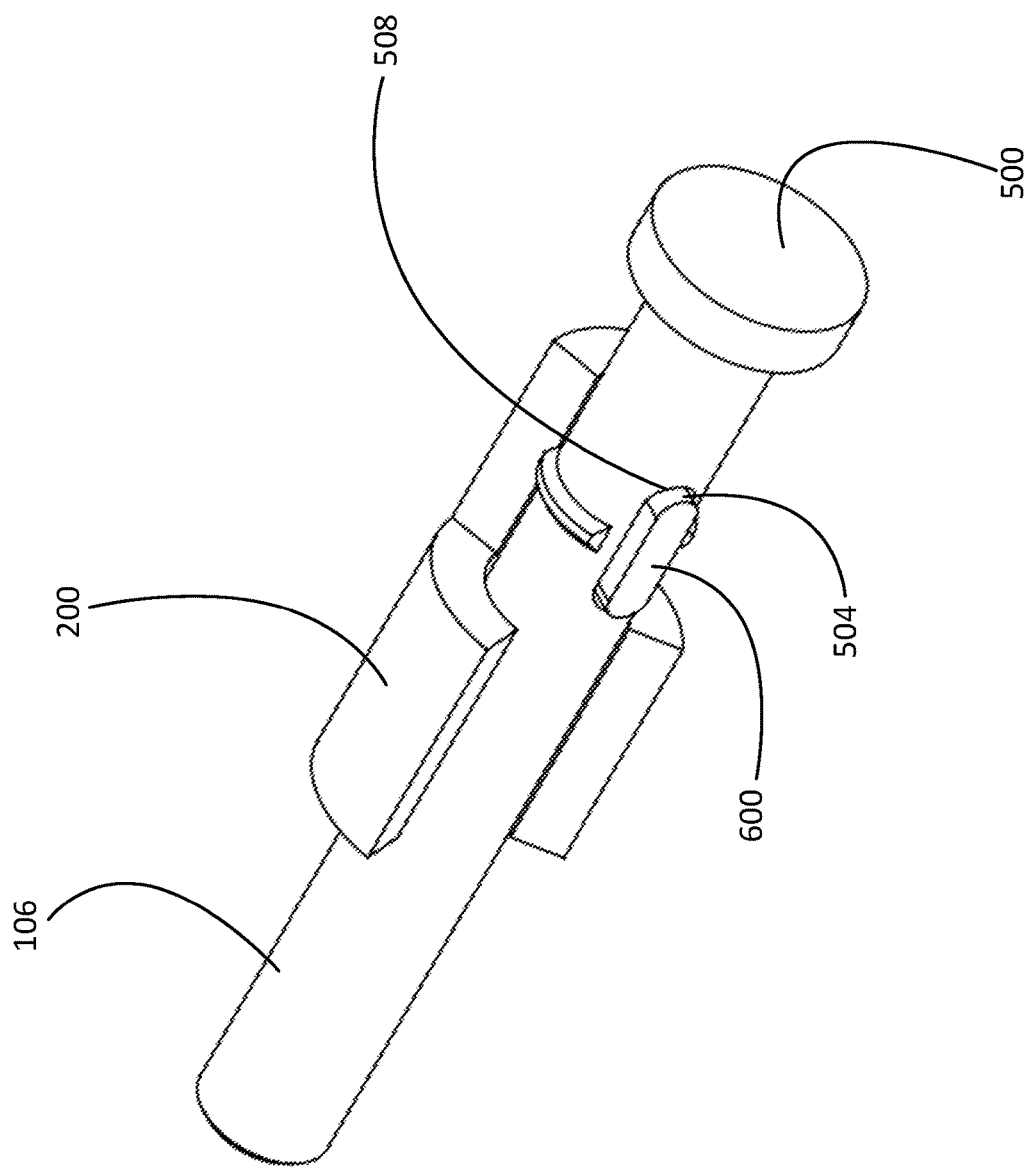
FIG. 7 is a perspective view of a hinge pin lock coupled to the middle of a hinge pin.
Figure 8:
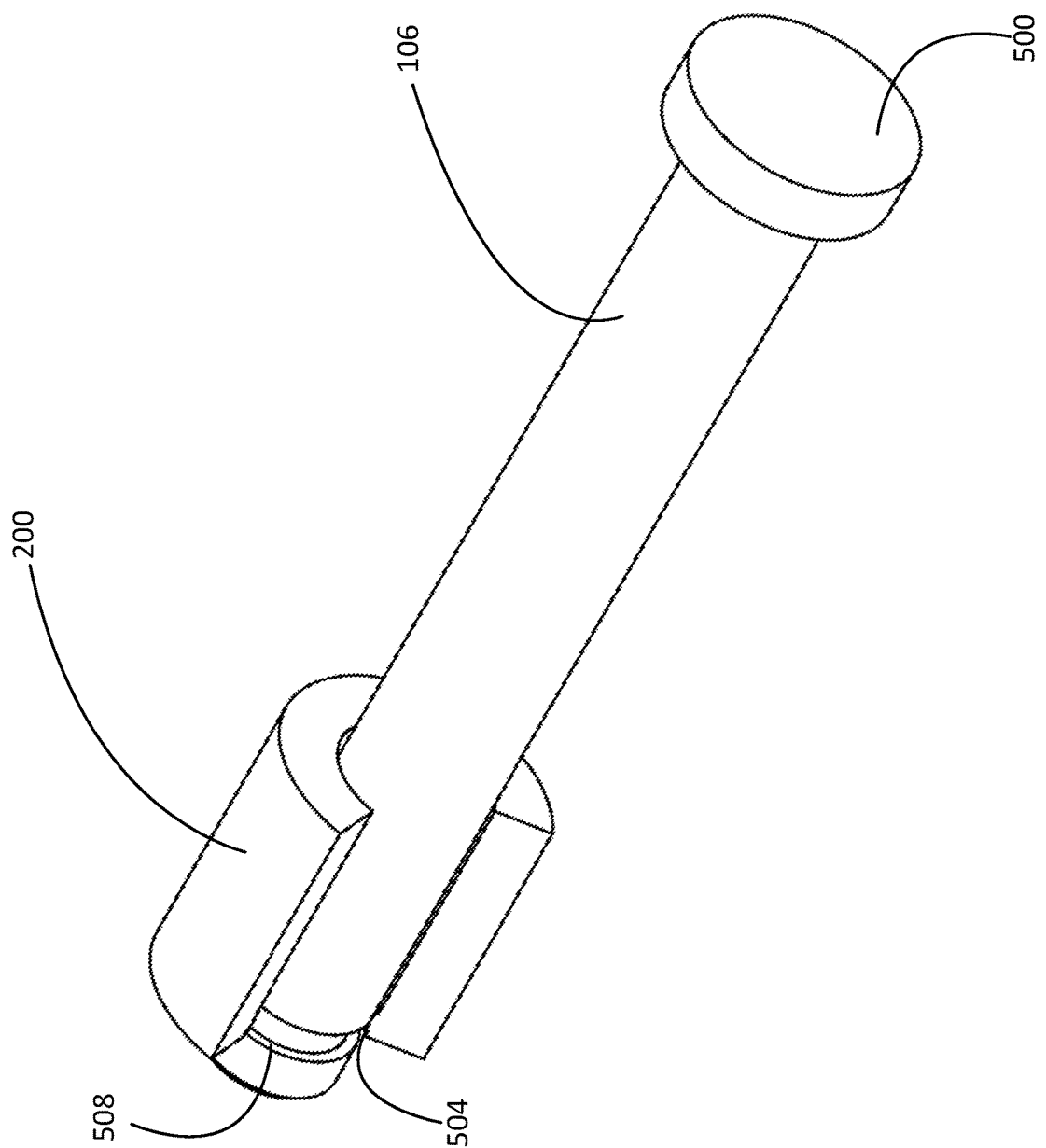
FIG. 8 is a perspective view of a hinge pin lock coupled to the end of a hinge pin.

According to various embodiments, a hinge pin lock 200 configured to engage with a single hinge pin 106 may couple with the pin 106 in a variety of locations on the pin 106. For example, FIG. 7 shows perspective view of a non-limiting example of a hinge pin lock 200 coupled to the middle of a hinge pin 106, while FIG. 8 shows a perspective view of a non-limiting example of a hinge pin lock 200 coupled near the end of a hinge pin 106, leaving the end exposed. Of course, in other embodiments, a hinge pin lock 200 may couple to a single pin 106 in other locations as well, and may or may not leave the end of the pin 106 exposed.

A hinge pin lock 200 configured to couple with a single pin 106 may do so using any of the structures or designs previously discussed in the context of assemblies 100 having two hinge pins. For example, the hinge pin lock 200 shown in FIG. 7 is coupled to a hinge pin 106 through a protrusion 600 configured to mate with an aperture on the pin 106, similar to the non-limiting example shown in FIG. 6. Additionally, the hinge pin lock 200 shown in FIG. 8 is coupled to a hinge pin 106 having a notch sized to receive a projection on the inside of the hinge pin lock 200, similar to the non-limiting example shown in FIGS. 5A-5C.

As in the embodiments configured to couple with two hinge pins, the interaction between a hinge pin 106 and a hinge pin lock 200 configured to receive a single pin may be discussed in terms of locking surfaces and pin capture surfaces. According to various embodiments, including those shown in FIGS. 7 and 8, a single pin hinge pin lock 200 comprises a locking surface 504, and the pin 106 comprises a pin capture surface 508. When the hinge pin lock 200 is installed, the locking surface 504 is between the pin capture surface 508 and the head 500 of the pin 106.

In many of the embodiments comprising two hinge pins, removal of a hinge pin (e.g. pin 106, etc.) from an electrical device cover assembly 100 without first removing the hinge pin lock 200 is prevented because the hinge pin lock 200 couples the two pins to each other; one pin cannot be pulled out without pulling the other pin in, a movement which may be prevented by the head of the pin. In other embodiments comprising two hinge pins, as well as various single pin embodiments, the removal of a hinge pin while it is coupled to a hinge pin lock may be prevented by a collision between the hinge pin lock 200 and some internal structure belonging to the base 104 and/or the lid 102 of an electrical device cover assembly 100. See, for example, FIG. 9.

Figure 9:
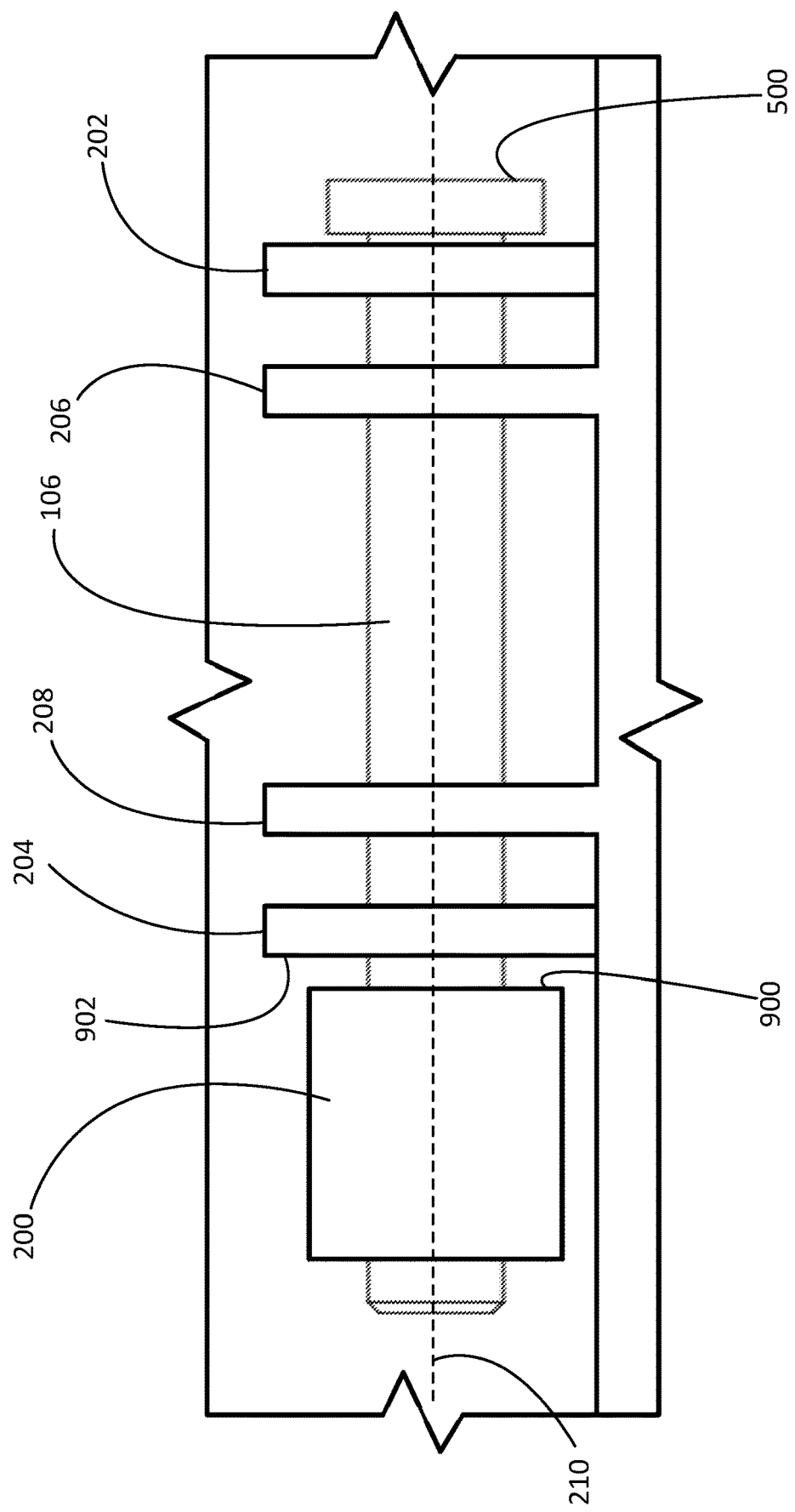
FIG. 9 is a close-up view of a hinge pin coupled to a hinge pin lock inside of an electrical device cover assembly.

FIG. 9 depicts a close-up view of a non-limiting example of a hinge pin 106 coupled to a hinge pin lock 200 inside of an electrical device cover assembly 100. As shown, the pin 106 is coupled to a first lid hinge aperture 202, a second lid hinge aperture 204, a first base hinge aperture 206, and a second base hinge aperture 208. The hinge pin lock 200 is coupled to the pin 106, similar to the coupling shown in FIG. 8. As shown, a portion of the lid 102 (specifically, the second lid hinge aperture 204) prevents the pin 106 from being pulled out of the assembly 100 along the axis 210 while the hinge pin lock 200 is coupled to the pin 106. Once the hinge pin lock 200 is removed from the pin 106, the pin 106 may be slid out of the assembly 100 along the axis 210.

In some embodiments, comprising either one pin or two, removal of a locked hinge pin (i.e. a hinge pin coupled to a hinge pin lock 200) may be prevented by a portion of a lid 102, while in other embodiments such a removal may be prevented by a portion of a base 104. In still other single or double pin embodiments, removal of a hinge pin coupled to a hinge pin lock 200 may be prevented because the hinge pin lock 200 is fixedly coupled to either the lid 102 or the base 104. In yet other embodiments, the hinge pin lock 200 may be an integral part of either the lid 102 or the base 104.

In some single or double pin embodiments of an electrical device cover assembly 100, removal of a locked pin may be inhibited because the hinge pin lock 200 engages with a portion of the lid 102 or the base 104 in a manner that prevents certain movement along axis 210, similar to how a hinge pin lock 200 engages with a pin 106. For example, in some embodiments, the lid 102 or the base 104 may comprise a structure having a capture surface that interacts with a locking surface of the hinge pin lock 200 in a fashion similar to what has been described for hinge pins. See, for example, capture surface 902 and locking surface 900 of FIG. 9. Of course, it should be clear to those skilled in the art that in other embodiments, a locking surface 900 and a capture surface 902 may be located elsewhere (e.g. capture surface 902 does not have to also be a hinge aperture, locking surface 900 does not have to be on the exterior of the hinge pin lock 200, etc.).

As an additional example, in one embodiment, base 104 may comprise an aperture sized and positioned to mate with a protrusion on a hinge pin lock when it is installed to couple with one or two hinge pins. As another specific example, in another embodiment, a lid 102 may comprise a structure sized and shaped like a segment of a hinge pin such that it may be received through an opening 302 on a hinge pin lock 200, and having a notch sized to receive a projection on the inside of a hinge pin lock 200 when it is installed to couple with one or two hinge pins. It should be clear to one skilled in the art that any of the methods or techniques for coupling a hinge pin lock 200 to a hinge pin 106 previously discussed may be adapted to also couple a hinge pin lock 200 to a portion of a lid 102 or a base 104.

Where the above examples, embodiments and implementations reference examples, it should be understood by those of ordinary skill in the art that other electrical device cover assemblies and assembly methods and examples could be intermixed or substituted with those provided. In places where the description above refers to particular embodiments of electrical device cover assemblies and customization methods, it should be readily apparent that a number of modifications may be made without departing from the spirit thereof and that these embodiments and implementations may be applied to other to cover assembly technologies as well. Accordingly, the disclosed subject matter is intended to embrace all such alterations, modifications and variations that fall within the spirit and scope of the disclosure and the knowledge of one of ordinary skill in the art.

What is claimed is:

1. An electrical device cover assembly, comprising:
a base comprising a first base hinge aperture and a second base hinge aperture;
a lid comprising a first lid hinge aperture and a second lid hinge aperture, the lid hingedly coupled to the base along an axis by a first pin coupled to both the first base hinge aperture and the first lid hinge aperture, and a second pin, separate from the first pin, coupled to both the second base hinge aperture and the second lid hinge aperture; and
a hinge pin lock comprising an opening sized to receive a portion of at least the first pin in a direction normal to the axis, a first locking surface, and a second locking surface opposite the first locking surface, the hinge pin lock directly and releasably coupled to the first pin and the second pin and positioned between the first base hinge aperture and the second base hinge aperture such that the first locking surface is between a first pin capture surface of the first pin and a head of the first pin, and the second locking surface is between a second pin capture surface of the second pin and a head of the second pin;
wherein one of the base and the lid further comprises a hinge lock shield covering a majority of the hinge pin lock when the lid is in a closed position with respect to the base.

2. The electrical device cover assembly of claim 1:
wherein the hinge pin lock further comprises a first protrusion comprising the first locking surface and a second protrusion comprising the second locking surface;
wherein the first protrusion is mated to the first pin at least along the first pin capture surface; and
wherein the second protrusion is mated to the second pin at least along the second pin capture surface.

3. The electrical device cover assembly of claim 1, wherein the hinge pin lock further comprises at least one removal tab extending away from the opening.

4. An electrical device cover assembly, comprising:
a base comprising a first base hinge aperture and a second base hinge aperture;
a lid comprising a first lid hinge aperture, and a second lid hinge aperture, the lid hingedly coupled to the base along an axis by a first pin coupled to both the first base hinge aperture and the first lid hinge aperture, and a second pin, separate from the first pin, coupled to both the second base hinge aperture and the second lid hinge aperture; and
a hinge pin lock comprising an opening sized to receive a portion of at least the first pin in a direction normal to the axis, a first locking surface, and a second locking surface opposite the first locking surface, the hinge pin lock directly and releasably coupled to the first pin and the second pin such that the first locking surface is between a first pin capture surface of the first pin and a head of the first pin, and the second locking surface is between a second pin capture surface of the second pin and a head of the second pin.

5. The electrical device cover assembly of claim 4, wherein one of the base and the lid further comprises a hinge lock shield covering a majority of the hinge pin lock when the lid is in a closed position with respect to the base.

6. The electrical device cover assembly of claim 4:
wherein the hinge pin lock further comprises a first protrusion comprising the first locking surface and a second protrusion comprising the second locking surface;
wherein the first protrusion is mated to the first pin at least along the first pin capture surface; and
wherein the second protrusion is mated to the second pin at least along the second pin capture surface.

7. An electrical device cover assembly, comprising:
a base comprising a first base hinge aperture;
a lid comprising a first lid hinge aperture, the lid hingedly coupled to the base along an axis by at least a first pin coupled to both the first base hinge aperture and the first lid hinge aperture; and
a hinge pin lock comprising an opening sized to receive a portion of the first pin in a direction normal to the axis, and a first locking surface, the hinge pin lock directly and releasably coupled to the first pin such that the first locking surface is between a first pin capture surface of the first pin and a head of the first pin;
wherein the base further comprising a second base hinge aperture, the lid further comprising a second lid hinge aperture, the lid further hingedly coupled to the base along the axis by a second pin coupled to both the second base hinge aperture and the second lid hinge aperture, wherein the hinge pin lock is further directly and releasably coupled to the second pin.

8. The electrical device cover assembly of claim 7, wherein a portion of one of the base and the lid is between the hinge pin lock and the head of the first pin.

9. The electrical device cover assembly of claim 7, wherein a capture surface of one of the base and the lid is between a locking surface of the hinge pin lock and the head of the first pin.

10. The electrical device cover assembly of claim 7, wherein the hinge pin lock is further coupled to the second pin such that a second locking surface of the second pin is between a second pin capture surface of the second pin and a head of the second pin.

11. The electrical device cover assembly of claim 7, wherein the hinge pin lock further comprises at least one removal tab extending away from the first pin.

12. The electrical device cover assembly of claim 7, wherein one of the base and the lid further comprises a hinge lock shield covering a majority of the hinge pin lock when the lid is in a closed position with respect to the base.

* * * * *